United States Patent [19]

Yamada et al.

[11] 4,340,909
[45] Jul. 20, 1982

[54] SOLID STATE AREA IMAGING APPARATUS

[75] Inventors: Takahiro Yamada, Katano; Hiromichi Tanaka, Hirakata, both of Japan

[73] Assignee: Matsushita Electric Industrial Co., Ltd., Kadoma, Japan

[21] Appl. No.: 166,115

[22] Filed: Jul. 7, 1980

[30] Foreign Application Priority Data

Jul. 5, 1979 [JP] Japan .................................. 54-85274

[51] Int. Cl.³ .............................................. H04N 3/14
[52] U.S. Cl. ..................................... 358/213; 357/32
[58] Field of Search ............... 358/212, 213; 307/311; 250/211 R, 211 J, 578; 357/30, 32

[56] References Cited

U.S. PATENT DOCUMENTS 4,179,711 12/1979 Nagumo ............................. 358/213
4,209,806 6/1980 Koike ................................... 358/212
4,233,632 11/1980 Akiyama ............................. 358/212

FOREIGN PATENT DOCUMENTS 55-23617 2/1980 Japan ................................... 358/213
1437328 5/1976 United Kingdom ................ 358/213

Primary Examiner—Michael A. Masinick
Attorney, Agent, or Firm—Wenderoth, Lind & Ponack

[57] ABSTRACT

Solid state area imaging apparatus consisting of a X-Y addressed photodiode array, a p-s conversion area and an output CCD register. In this apparatus, stored signal charges in the photodiode array are read out a line at a time into column lines during a horizontal blanking period. Then, signal charges or charges corresponding to the signal charges are transferred into the corresponding positions of the output CCD register and read out therefrom during a horizontal scanning period to produce a video signal.

16 Claims, 8 Drawing Figures

SOLID STATE AREA IMAGING APPARATUS

BACKGROUND OF THE INVENTION

This invention relates to a solid state area imaging apparatus which converts a two dimensional optical image into an electrical signal.

An ordinary area imaging apparatus employing a photodiode array is shown, for instance, in the WESCON Tech. papers, session 13-2 August 1967. Such an apparatus consists of photodiodes, switching elements such as MOS transistors and scanning shift registers. In such an apparatus, an electric charge, which is proportional to the intensity of the light incident upon each diode, is stored in each diode and is read out when the switching element which is connected to the diode is turned on by being addressed by both a vertical scanning shift register and a horizontal scanning shift register. A sequential video signal representing a black and white image of an object is obtained as an output of this apparatus.

The advantages of a X-Y addressed area imaging apparatus, such as that described above, are less blooming, a high sensitivity, a high quantum efficiency for light of short wave lengths (450 nm) and less dark current, such advantages being obtained by utilizing a p-n junction as a photosensor.

On the other hand, the disadvantages of a X-Y addressed area imaging apparatus include the existance of fixed pattern noise (FPN) caused by the non-uniformity of the horizontal multiplex switches, and a high random noise level which is caused by the large output capacitor and which increases in proportion to increases in the number of picture elements.

With respect to an area imaging apparatus which operates by means of charge transfer techniques, two methods, namely, the frame transfer method and the interline transfer method, have been proposed. An area imaging apparatus employing the frame transfer method is shown, for instance, in IEEE Trans. on Electron Device, ED-20, No. 3, p244, 1973. Such a frame transfer imaging apparatus, for example, consists of a photosensitive CCD array, a temporary storage CCD array and an output CCD register. A pattern of stored charges in the CCD array which represents an input optical image and which is formed by the entirety of the charges stored during one field interval is transferred into the temporary storage array during a vertical blanking period. Then, the pattern is shifted one horizontal line at a time into the output CCD register during a horizontal blanking period, and is read out by a high speed horizontal clock to produce a sequential video signal.

An imaging apparatus employing the interline transfer method, which is shown, for instance, in 1974 IEEE Intercon Tech. papers, session 2-2, consists of alternate columns of photosensitive elements, vertical transfer CCD registers and an output CCD register. During a vertical blanking period, signal charges detected which are by the photosensitive elements are transferred into the vertical transfer registers. These signal charges are then shifted one horizontal line at a time into the output CCD register during a horizontal blanking period, and transferred out by a horizontal clock.

Advantages of such charge transfer area imaging apparatus are a low FPN arising from the dark current which increases at a high temperature and less random noise due to less output capacitance.

On the other hand, disadvantages thereof are decreases in the output signal, which is caused by transfer losses, a small maximum transferable charge value and poor blooming and smearing characteristics.

SUMMARY OF THE INVENTION

An object of the invention is to provide a solid state area imaging apparatus having the advantages of both an X-Y addressed area imaging apparatus and a charge transfer area imaging apparatus.

DETAILED DESCRIPTION OF THE PREFERRED EMBODIMENTS

Figure 1:
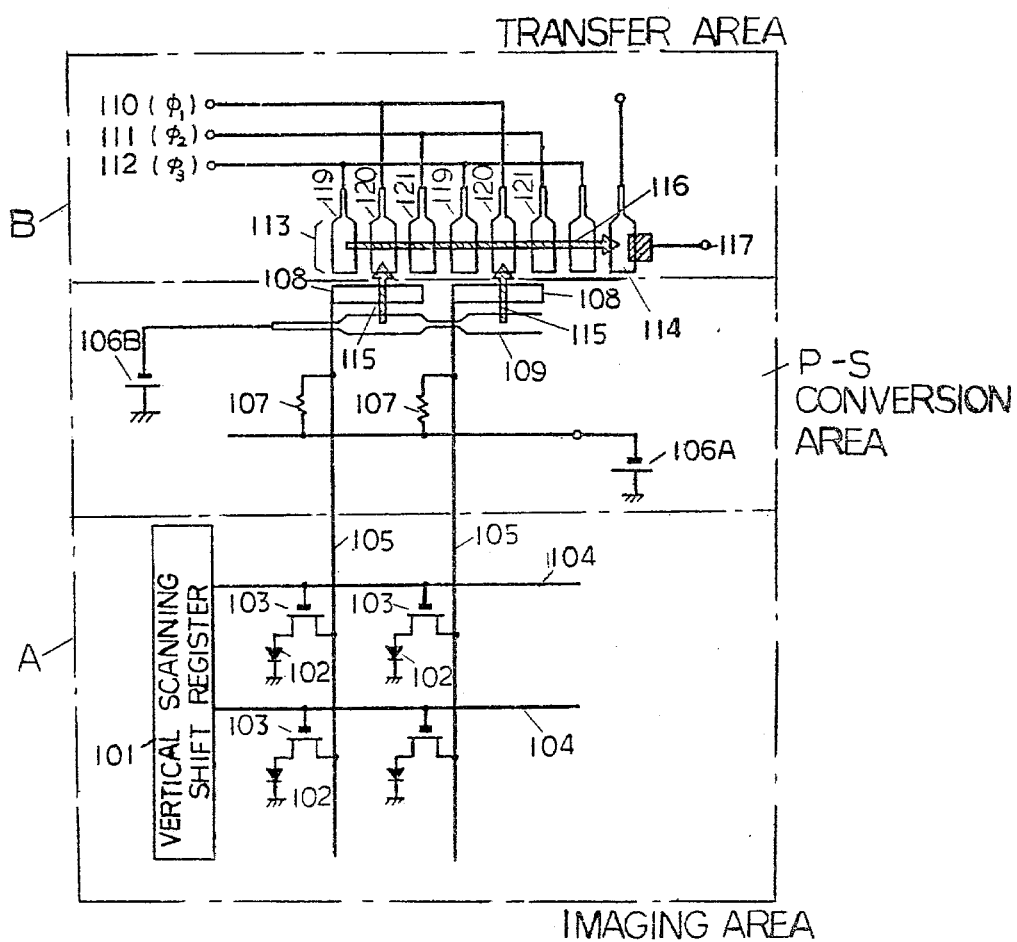
FIG. 1 is a schematic diagram showing an embodiment of the invention.

FIG. 1 shows the construction of one embodiment of a solid state area imaging apparatus according to this invention.

A sensing area A in FIG. 1 has the same construction as that of the conventional X-Y addressed area imaging apparatus and a transfer area B has the same construction as the output CCD register of a CCD area imaging apparatus.

When an addressing pulse from a vertical scanning shift register 101 is applied to a row line 104 during a horizontal blanking period, the MOS FETs 103 gate electrodes which are connected to the row line 104 turn on, and then the signal charges which are stored in the p-n junction of photodiodes 102 and which are in proportion to the intensity of the incident light from an object are transferred into column lines 105. The above-mentioned operation of the imaging area A is the same as that of conventional X-Y addressed area imaging apparatus.

The charge signals which are transfered into the column lines 105 one line at a time, flow through respective resistors 107 to a d-c voltage source 106A. The signal voltages which appear at the resistors 107 are applied to input gates 108. Under the control of the voltages of the input gates 108, the charges from an input diode 109, which is inversely biased by a d-c voltage source 106B, are injected into predetermined positions of corresponding bits of an output CCD register 113. The direction of the charge injection is shown by the arrows 115 in FIG. 1. Each bit is formed by a set of MIS (metal-insulator-silicon) elements 119, 120 and 121. In FIG. 1, the charges are injected into MIS structures 120. As the result thereof, one line of signal charges whose values are proportional to those of the stored signal charges are injected into the corresponding bits of the output CCD register 113. The d-c voltage sources 106A, 106B, registers 107, input diodes 109 and input gates 109 constitute a parallel-serial conversion (p-s conversion) area.

The injected signal charges in the CCD register 113 are transferred in the direction of the arrow 116 by 3φ horizontal transfer clocks 110, 111 and 112 during the horizontal scanning period, and then read out from the output terminal 117 through an output gate 114. After all the signal charges are read out from the output register 113, the next row line is accessed by the vertical scanning shift register 101 and the signal charges stored in the next line of the photodiodes 102 are transferred into the corresponding column line 105 during the horizontal blanking period. A next line of signal charges are injected from the input diode 109 into the same position as that of the previous horizontal scan, and then read out from the output CCD register 113 during the horizontal scanning period to produce a sequential video signal.

According to this embodiment, low blooming, a high sensitivity, a high quantum efficiency for light of short wave lengths (450 nm) and low dark current characteristics due to the X-Y addressed photodiode imaging array 102, and a low FPN and low random noise characteristics due to the CCD output register 113 are obtained.

Figure 2:
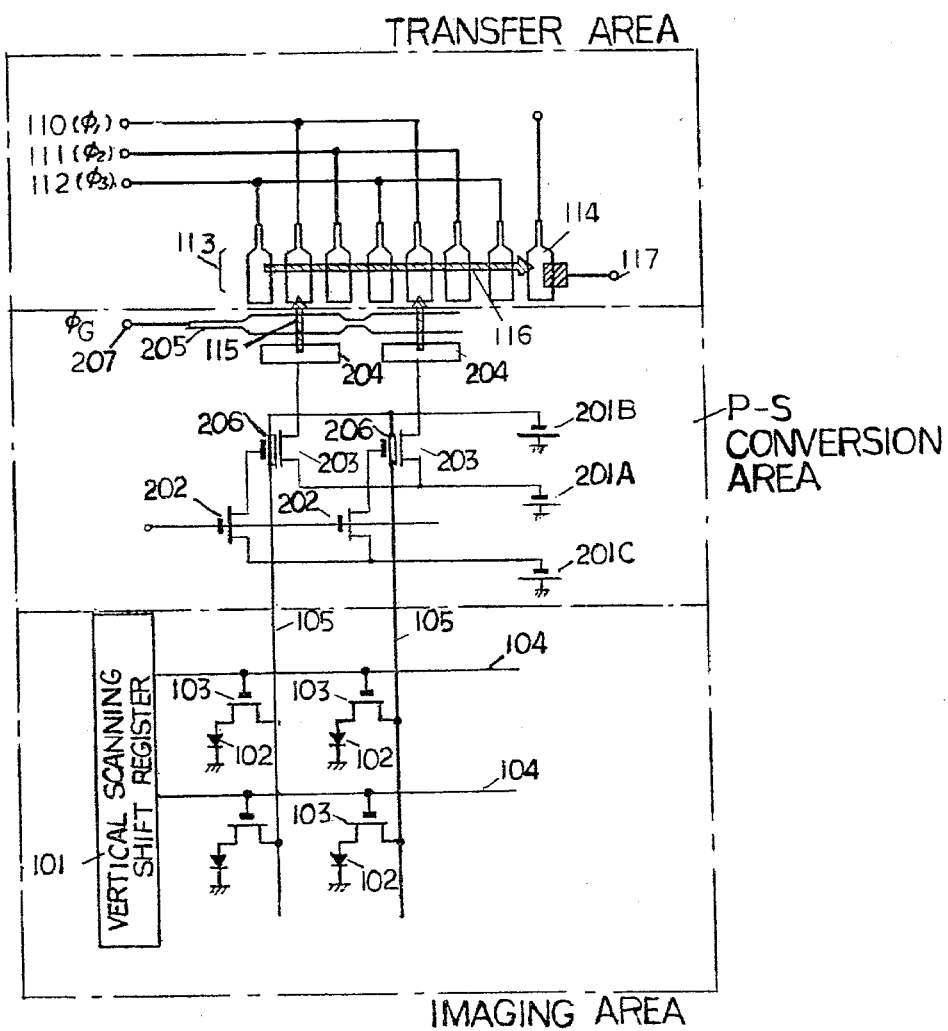
FIG. 2 is a schematic diagram showing an another embodiment of the invention.

FIG. 2 shows an another embodiment of the present invention. The difference of this embodiment with respect to previous embodiment is the construction of the p-s conversion area which consists of a floating gate amplifier.

A line of signal charges, which are transferred into the column lines 105, flow through a polysilicon floating gates 206 into a d-c voltage source 201B. In response to the flow of the signal charges, MOS FETs 203, having the floating gates 206, conduct and then the charges are injected into diffusion regions 204 from a d-c voltage source 201A. The value of the injected charges are in proportion to the signal charges. The charges injected into the diffusion regions 204 are transferred into the corresponding positions of the output CCD register 113 through switching gates 205 under the control of a gate pulse applied to a terminal 207 during the horizontal blanking period. MOS FETs 202 are switching transistors for resetting the floating gates 206 so that the voltage of the gates is equal to that of a d-c voltage source 210C.

The transfered signal charges in the corresponding positions of the CCD 113 are read out therefrom during the horizontal scanning period to produce the sequential video signal in the same manner as the embodiment of FIG. 1.

Figure 3:
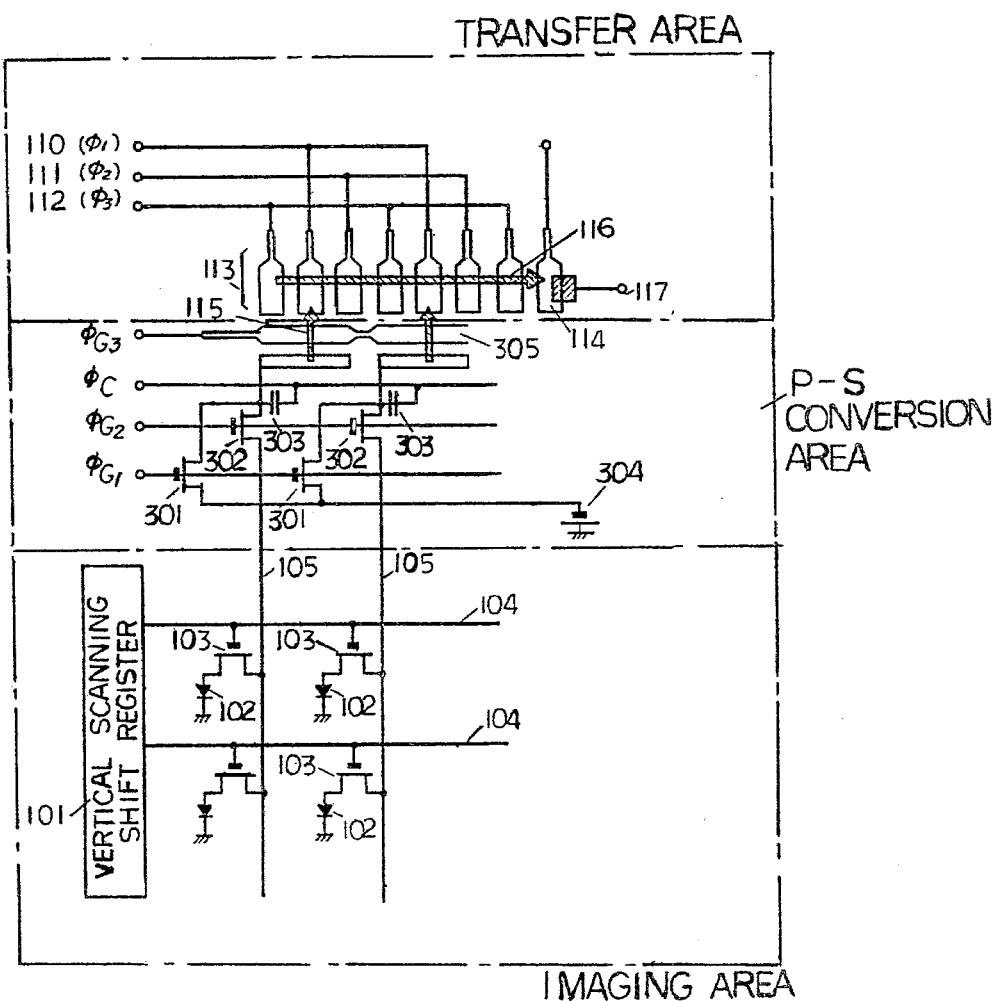
FIG. 3 is a schematic diagram showing a further embodiment of the invention.

FIG. 3 shows a further embodiment of the present invention utilizing a temporary storage capacitor in the p-s conversion area.

Figure 4A:
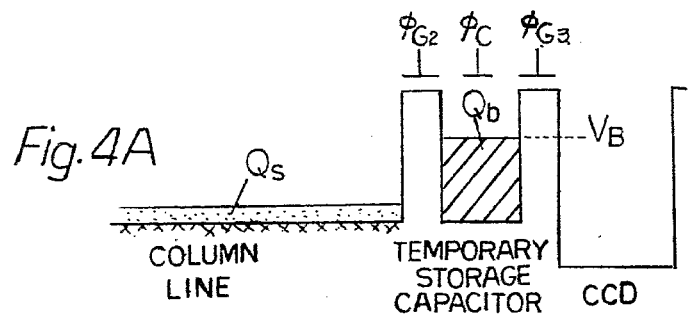
FIGS. 4A, 4B, 4C, 4D and 4E are schematic potential diagrams for describing the operation of the embodiment of FIG. 3.
Figure 4B:
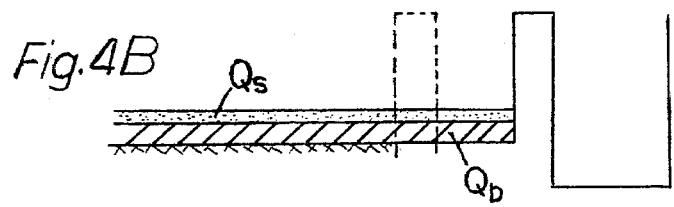
Figure 4C:
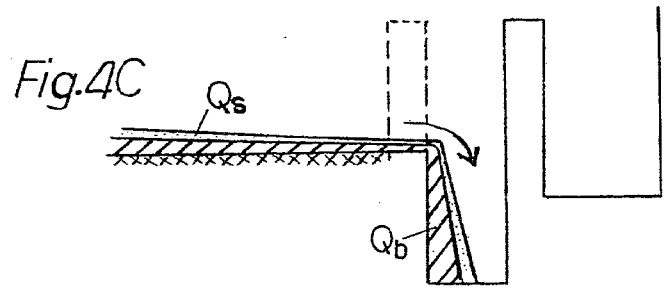
Figure 4D:
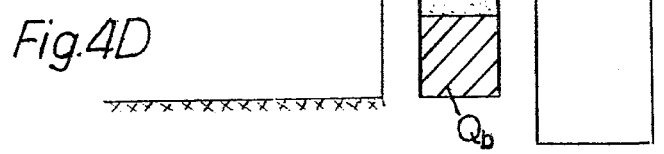
Figure 4E:
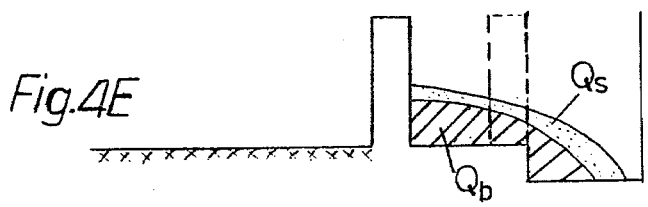

In this embodiment, before the row line 104 is addressed, a gate pulse $\phi_{G1}$ is applied to the gate electrodes of MOS FETs 301 during the horizontal blanking period. Therefore, MOS FETs 301 turn on, so that temporary storage capacitors 303 are charged to a potential which is substantially equal to the voltage $V_B$ of a d-c voltage source 304, such as shown in FIG. 4A. Then, a line of signal charges are read out into the column line 105 by the application of an address pulse from the vertical scanning shift register 101. FIGS. 4A, 4B, 4C, 4D and 4E are schematic potential diagrams for describing the operation of this embodiment, wherein $Q_s$ is the read out signal charge and $Q_b$ is the bias charge stored in the temporary storage capacitor 303. Subsequently, a gate pulse $\phi_{G2}$ is applied to the gate electrodes of MOS FETs 302 to turn them on. Therefore, the bias charges $Q_b$ of capacitors 303 are injected into the corresponding column line 105 so as to be combined with the read out signal charges $Q_s$, such as shown in FIG. 4B. After this combination of charges, a pulse $\phi_c$ which has the same polarity as that of the gate pulse $\phi_{G1}$ or $\phi_{G2}$ is applied to other terminals of the temporary storage capacitors 303. As a result, both charges $Q_s$ and $Q_b$ are transfered back into capacitors 303 in a Bucket Brigade mode during the application of the pulse $\phi_c$. After the MOS FETs 302 are cut off by removing the gate pulse $\phi_{G2}$, the pulse $\phi_c$ is turned off. Accordingly, combined charges $Q_s$ and $Q_b$ are temporarily stored in the capacitors 303, such as shown in FIG. 4D. When a gate pulse $\phi_{G3}$ is applied to switching gates 305, the combined charges $Q_s$ and $Q_b$ are read out into the corresponding positions of the output CCD register 113, such as shown in FIG. 4E. These charges are then transferred out during the horizontal scanning period from the CCD register 113 with the transfer clocks 110, 111 and 112 so as to produce the video signal.

According to this embodiment, the bias charges are combined with the signal charges, and a high transfer efficiency is obtained even if the signal charges are very large.

Although this invention has been particularly shown and described, it is contemplated that various changes and modifications may be made without departing from the scope of the invention as set forth in the following claims. The embodiments of the present invention in which an exclusive property or privilege is claimed are defined as follows.

What is claimed is:

1. A solid state area imaging apparatus for producing a video signal representing an optical image of an object, said apparatus comprising:
   a photosensitive means for converting impinging radiation into electrical signals and which consists of a plurality of photosensitive elements which are substantially linearly arranged in lines in both a horizontal and vertical scanning direction;
   a scanning means operatively connected to said photosensitive means for accessing one line of said photosensitive elements at a time and for reading out signal charges therefrom one line at a time;
   a charge transfer means, including an output register means and a p-s conversion means which is operatively connected between said photosensitive means and said output register means, for receiving said signal charges and for injecting charge signals into predetermined positions of said output register means, each of said charge signals corresponding to each of said signal charges, wherein said output register means transfers said charge signals out therefrom to produce a video signal.

2. A solid state area imaging apparatus as claimed in claim 1, wherein said photosensitive means comprises a photodiode array.

3. A solid state area imaging apparatus as claimed in claim 1, wherein said output register means comprises CCD register.

4. A solid state area imaging apparatus as claimed in claims 1, 2 or 3, wherein said p-s conversion means comprises a detection means operatively connected to said photosensitive means for detecting said signal charges and a charge injection means operatively connected to said detection means for injecting charge signals into said predetermined positions of said output register means in response to the detected signal of said detection means.

5. A solid state area imaging apparatus as claimed in claim 4, wherein said detection means consists of a plurality of resistors which are arranged so as to detect said signal charges which are read out from said photosensitive means by said scanning means.

6. A solid state area imaging apparatus as claimed in claim 4, wherein said detection means consists of a plurality of floating gates which are arranged so as to detect said signal charges which are read out from said photosensitive means by said scanning means.

7. A solid state area imaging apparatus as claimed in claims 1, 2 or 3, wherein said p-s conversion means comprises:
a temporary storage means for temporarily storing said signal charges;
a gate means operatively connected between said photosensitive means and said temporary storage means for transferring said signal charges which are read out from said photosensitive means by said scanning means into said temporary storage means; and
a charge injection means operatively connected between said temporary storage means and said register means for injecting said charge signals which correspond to said signal charges and which are stored in said temporary storage means into said predetermined positions of said output register means.

8. A solid state area imaging apparatus for producing a video signal representing an optical image of an object, said apparatus comprising:
a photosensitive means for converting impinging radiation into electrical signals and which consists of a plurality of photosensitive elements which are substantially linearly arranged in lines in both a horizontal and vertical scanning direction;
a vertical scanning means operatively connected to said photosensitive means for accessing one line of said photosensitive elements at a time and for reading out signal charges from one line of photosensitive elements one line at a time into a plurality of column lines;
a detection means which consists of a plurality of charge detection elements which are connected to said column lines and which detect said signal charges, respectively; and
a charge transfer means, including an output register means and a charge injection means which is operatively connected between said detection means and said output register means, for injecting charge signals into predetermined positions of said output register means, said charge signals corresponding to detected signals of said detection means, wherein said output register means transfers said injected charge signals out therefrom to produce a video signal.

9. A solid state area imaging apparatus as claimed in claim 8, wherein said detection means consists of a plurality of resistors each of which is connected to its corresponding column line and which detects signal charges read in from said photosensitive means by said vertical scanning means.

10. A solid state area imaging apparatus as claimed in claims 8 or 9, wherein said charge injection means includes a diode which is reverse biased and a plurality of gates each of which is respectively connected to one of said charge detection elements for injecting a charge signal through said diode into each predetermined position of said output register means, and wherein the value of said charge is in proportion to said detected signal of said charge detection element.

11. A solid state area imaging apparatus as claimed in claim 8, wherein said detection means consists of a plurality of floating gates each of which is connected to its corresponding column line and which detects the signal charge read in from said photosensitive means by said vertical scanning means.

12. A solid state area imaging apparatus as claimed in claims 8 or 11, wherein said charge injection means includes a plurality of gate elements each of which injects a charge signal from a d-c source into each predetermined position of said output register means, and wherein the value of said charge signal is in proportion to said detected signal of said detection element.

13. A solid state area imaging apparatus as claimed in claim 12, further including a resetting means for resetting said floating gates before signal charges are read out into said column lines.

14. A solid state area imaging apparatus for producing a video signal representing an optical image of an object, said apparatus comprising:
a photosensitive means for converting impinging radiation to electrical signals and which consists of a plurality of photosensitive elements which are arranged in lines in both horizontal and vertical scanning directions;
a vertical scanning means operatively connected to said photosensitive means for accessing one line of said photosensitive elements at a time and for reading out signal charges from a line of photosensitive elements one line at a time into a plurality of column lines;
a temporary storage means consisting of a plurality of storage elements for temporarily storing said signal charges;
a gate means consisting of a plurality of gate elements each of which is respectively connected between one of said column lines and its storage element and which respectively transfers said signal charge from said column line to said storage element; and
a charge transfer means, including an output register means and a charge injection means which is operatively connected between said temproary storage means and said output register means, for injecting charge signals into predetermined positions of said output register means during a horizontal blanking period, said charge signals corresponding to said signal charges stored in said temporary storage means, wherein said output register means transfers said injected charge signals out during a horizontal scanning period to produce a video signal.

15. A solid state area imaging apparatus as claimed in claim 14, further comprising a bias charge injection means operatively connected to said temporary storage means for injecting a bias charge into each of said storage elements before each of said gate elements of said gate means transfers said signal charge thereto from its respective column line.

16. A solid state area imaging apparatus as claimed in claim 15, further comprising a circuit means coupled to said temporary storage means for applying a pulse to each of said storage elements for gathering the signal charge and the bias charge thereto, said pulse being applied before said charge injection means injects said charge signals into said predetermined positions of said output register means.

* * * * *